United States Patent
Karr et al.

(10) Patent No.: US 8,095,850 B1
(45) Date of Patent: Jan. 10, 2012

(54) ROTATIONALLY INVARIANT NON-COHERENT BURST CODING AND DECODING

(75) Inventors: Lawrence J. Karr, Santa Monica, CA (US); Phillip B. Hess, Los Angeles, CA (US)

(73) Assignee: Alfred E. Mann Foundation for Scientific Research, Santa Clara, CA (US)

(*) Notice: Subject to any disclaimer, the term of this patent is extended or adjusted under 35 U.S.C. 154(b) by 212 days.

(21) Appl. No.: 12/707,178

(22) Filed: Feb. 17, 2010

Related U.S. Application Data (62) Division of application No. 11/526,461, filed on Sep. 25, 2006, now Pat. No. 7,779,332.

(51) Int. Cl.
    *H03M 13/00* (2006.01)
(52) U.S. Cl. .......................... 714/758; 714/781
(58) Field of Classification Search .............. 714/758, 714/781
    See application file for complete search history.

(56) References Cited

U.S. PATENT DOCUMENTS

| | | | | |
|---|---|---|---|---|
| 4,397,022 A * | 8/1983 | Weng et al. | .................... | 714/783 |
| 4,584,685 A * | 4/1986 | Gajjar | ............................ | 714/751 |
| 4,701,939 A * | 10/1987 | Stutt et al. | ...................... | 375/366 |
| 4,827,475 A * | 5/1989 | Grover et al. | .................. | 370/527 |
| 4,901,317 A * | 2/1990 | Rushforth et al. | ............ | 714/783 |
| 4,926,169 A * | 5/1990 | Tong et al. | .................... | 340/12.1 |
| 6,084,534 A * | 7/2000 | Postol | ............................. | 341/50 |
| 6,189,125 B1 * | 2/2001 | Classon | ......................... | 714/783 |
| 6,199,189 B1 * | 3/2001 | Classon | ......................... | 714/783 |
| 6,324,668 B1 * | 11/2001 | Classon | ......................... | 714/783 |

* cited by examiner

*Primary Examiner* — Joseph D Torres
(74) *Attorney, Agent, or Firm* — Malcolm J. Romano (57) ABSTRACT

An apparatus, system and method can be arranged for coding and/or decoding with a phase invariant coding scheme that is useful for short burst signaling devices. 10-bit data is mapped into a 12-bit data with a non-coherent burst code mapper. A parity generator creates a 12-bit parity data to form a 24-bit extended binary Golay code from the 12-bit data. The values for selected bit fields in the 12-bit data and 12-bit parity data are swapped to generate I and Q data such that sensitivity to changes in rotational phase is removed. I and Q data can be used by a transmitter to transmit a rotationally-invariant signal. On receipt, I and Q signals can be recovered, reverse swapped to generate the parity and data signals, and remapped to recover the transmitted 10-bit data. The receiver can also be arranged to use a soft decoding method for improved signal integrity.

8 Claims, 9 Drawing Sheets

ROTATIONALLY INVARIANT NON-COHERENT BURST CODING AND DECODING

CROSS-REFERENCE TO RELATED APPLICATIONS

This application is a divisional of U.S. non-provisional application Ser. No. 11/526,461 filed on Sep. 26, 2006.

FIELD OF THE INVENTION

The present disclosure relates generally to communication systems using short burst signaling. More particularly, the present disclosure relates to an apparatus, system and method for coding and/or decoding information in a communication system with a phase invariant coding scheme that is useful for devices that employ short burst signals.

BACKGROUND OF THE INVENTION

Error correction and detection has great practical importance in communication systems. Various noise and other impairments may occur in the transmission and reception of signals in the communication system. Error detection and correction methods can help minimize the effects of transmission errors by detecting, locating and correcting them.

A variety of error-correction schemes can be provided that are computationally intensive, or require excessive redundancies in the data coding scheme. Error correction methodologies in some applications, such as a sender-receiver system, are achieved with a detection system that works in tandem with an automatic repeat request scheme that notifies the sender that a portion of the data sent was received incorrectly and will need to be retransmitted. A variety of schemes can be employed for error-detection such as repetition, parity, and cyclic redundancy.

In an example repetition schemes, the transmission data is broken into blocks that are repeatedly sent. For example, if we want to send a data block of "1101", we may repeat transmission of this block three times each, yielding the following non-ideal result: "1101", "1111", and "1101". For this example, one of the data blocks has an error that can be corrected by detecting the anomaly in one of the three data blocks.

An example parity scheme includes one or more parity bits included in the transmitted blocks to ensure that the data is valid. The data is broken up into blocks of bits, and the total number of "1" bits is counted for the data block. A "parity bit" is added to the transmission block, where the party bit is set to a "1" or cleared to a "0" based on the number of one bits being odd or even. When consecutive transmission blocks overlap, the parity bits can be used to isolate and often correct the error.

A cyclic redundancy (CRC) check scheme can be used to provide more powerful error detection. The cyclic redundancy check scheme evaluates each block of data and identifies polynomial coefficients based on the data. The polynomial coefficients are applied to generate a polynomial, which is then by a fixed polynomial. The coefficients that result from the division are used as the redundant data bits in the CRC field of the data transmission, which includes a payload with the original data. When the transmission is received, the CRC field can be verified by comparing it to a computed CRC from the payload data bits. Alternatively, the data from the payload can be checked by multiplying the fixed polynomial with the CRC and comparing it to the received data payload.

An error-correcting code or ECC is a code in which each data signal conforms to specific rules of construction so that departures from this construction can be detected in the received signal and appropriately corrected. Examples of error-correcting codes include: Hamming codes, Reed-Solomon codes, Reed-Muller codes, Binary Golay codes, as well as others. The simplest error correcting codes can correct single-bit errors (single error correction), while other error correcting codes can correct multi-bit errors and/or multi-word errors.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION OF THE PREFERRED EMBODIMENT

Various embodiments are described more fully below with reference to the accompanying drawings, which form a part hereof, and which show specific example embodiments for practicing various embodiments. However, other embodiments may be implemented in many different forms and should not be construed as limited to the embodiments set forth herein; rather, these embodiments are provided so that this disclosure will be thorough and complete. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Briefly stated, the present disclosure relates generally to communication systems using short burst signaling methods. An apparatus, system and method can be arranged for coding and/or decoding with a phase invariant coding scheme that is useful for short burst signaling devices. 10-bit data is mapped into a 12-bit data with a non-coherent burst code mapper. A parity generator creates a 12-bit parity data to form a 24-bit extended binary Golay code from the 12-bit data. The values for selected bit fields in the 12-bit data and 12-bit parity data are swapped to generate I and Q data such that sensitivity to changes in rotational phase is removed. I and Q data can be used by a transmitter to transmit a rotationally-invariant signal. On receipt, I and Q signals can be recovered, reverse swapped to generate the parity and data signals, and remapped to recover the transmitted 10-bit data. The receiver can also be arranged to use a soft decoding method for improved signal integrity.

Although many of the examples found herein are described within the context of a sensory device that can be used to communicate with a main control unit (MCU), applications of the devices are not so limited. In one example, the sensory device is configured to communicate with other sensory devices (e.g., bionically implanted devices or "bions" that can be arranged to "talk" to one another). In another example, the sensory device is configured to communicate with other devices such as bions that are arranged to stimulate or influence muscular functions, stimulate nerves to influence or control motor function, as well as others. In yet another example, the sensory device is configured to communicate with a data-logging device that is external to the body (e.g., a computer system, a monitoring system, etc). In still another example, the sensory device is configured in communication with a set of electrodes that are implanted in a neural pathway.

In a further example, the sensory device is configured to stimulate or influence a communication path to a sensory system (e.g., another neural path), a physiological control system (e.g., muscular contraction), or the brain. Such examples can be accomplished by mechanisms that are internal to the body (e.g., through an electrode, through another implanted bion, or through some other device) or external to the body (e.g., to an external master control unit, an external computing device, etc.). Many varieties of circuits can be arranged to provide such functions where sensory information is relayed, processed, data-logged, or otherwise handled and communicated.

The examples described above are only to be construed as example applications for such sensory devices as described below. Many embodiments can be made without departing from the spirit and scope of the invention, and the invention resides in the claims that follow this disclosure.

Example Operating Environment

Figure 1:
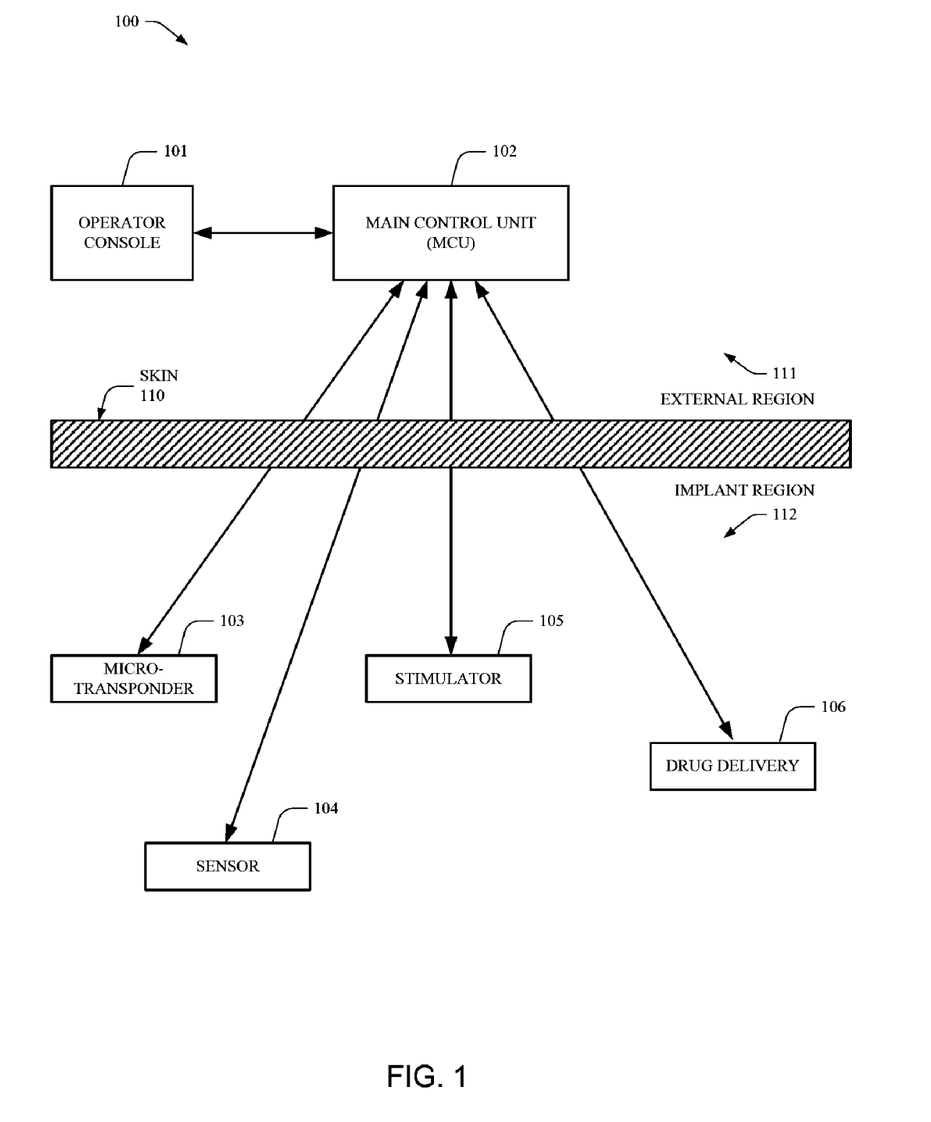
FIG. 1 is an illustration of an example operating environment for the present disclosure.

FIG. 1 is an illustration of an example operating environment (100) for the present disclosure. As illustrated in FIG. 1, an example system may include a main control unit or MCU (102) and one or more wireless communication devices (103-106). An operator console (101) can be arranged to communicate, either wirelessly or via a wired transmission, with the MCU (102). The MCU (102) can be located in an external region (111) or implanted in a person in some other region such as a body cavity or other implant region (112) that is beneath the skin (110) of a person or an animal. The wireless communication devices (103-106) are arranged in communication with the MCU (102) via a wireless communication system that is arranged according to the presently disclosed non-coherent short burst signaling methods.

Example wireless communication devices, which are all arranged to use the presently described short-burst signaling methods, include: a micro-transponder device (103), a sensory device (104), a stimulator device (105), and a drug delivery device (106). The micro-transponder device (103) may be useful as a part of a locator system, where the device may be body implantable, or worn attached to an article of clothing. The sensory device (104) may be useful to collect sensory information such as may be useful for a body implanted neural prosthetic device, or to monitor sensory information for other purposes such as heart rate monitoring, etc. The stimulator device (105) may be useful to stimulate neural pathways in a body implanted application. The drug delivery device (106) is useful in body implanted application where precise drug delivery is desired. Each of the functions of the described wireless communication devices may be combined into a single device, or separated into multiple devices as may be desired for a particular application.

In one example body implanted application, a person may have lost or impaired ability to sense touch in a particular region of the body such as a hand. One or sensory devices (104) are placed in the implant region (112) as bionic implants where sensor information may be desirable. The sensor devices (104) can be arranged to provide sensory information that is communicated to the brain, where the brain receives the sensory information and interprets the sensory information as touch or feel.

In another example body implanted application, the MCU (102) may be implanted in the body and coupled to a neural pathway. For this example, the MCU is arranged to receive sensory information that is provided via wireless communication from one or more implanted sensor devices (104). The MCU is further arranged to process the sensory information for a particular application. In one example application, the MCU communicates wirelessly with one or more body implanted stimulator devices (105) to affect motor functions, muscular contractions, etc. In another example application, the MCU communicates wirelessly with one or more body implanted drug delivery devices (106) to precisely deliver a desired drug based on an identified body condition from the sensory information. In still another application, the sensory information is communicated to an area of the brain for interpretation as touch or feel.

While many of the above described examples are for medical-type body implantable devices, these examples are merely for illustrative purposes. The present disclosure contemplates all varieties of short-burst signal communication applications including but are not limited to body implanted applications, non-implanted applications, medical applications and non-medical applications. One type of example application is for a toy or a novelty item. Another type of example application is for body wearable accessories such as a watch, a wrist-band, a leg-band, a collar, or a jewelry items such as a ring, a pin, a broach, etc. Still another type of example application is for personal accessories such as a key-chain, a key, a pen or pencil, a wallet, a credit-card style device, a personal data assistant (PDA) or personal information manager (PIM), a cellular telephones, etc. Yet another type of example application is for a device that can be affixed or sewn into an article of clothing, or to some other personal item such as a back-pack, suitcase, briefcase, purse, pocketbook, etc.

Figure 2:
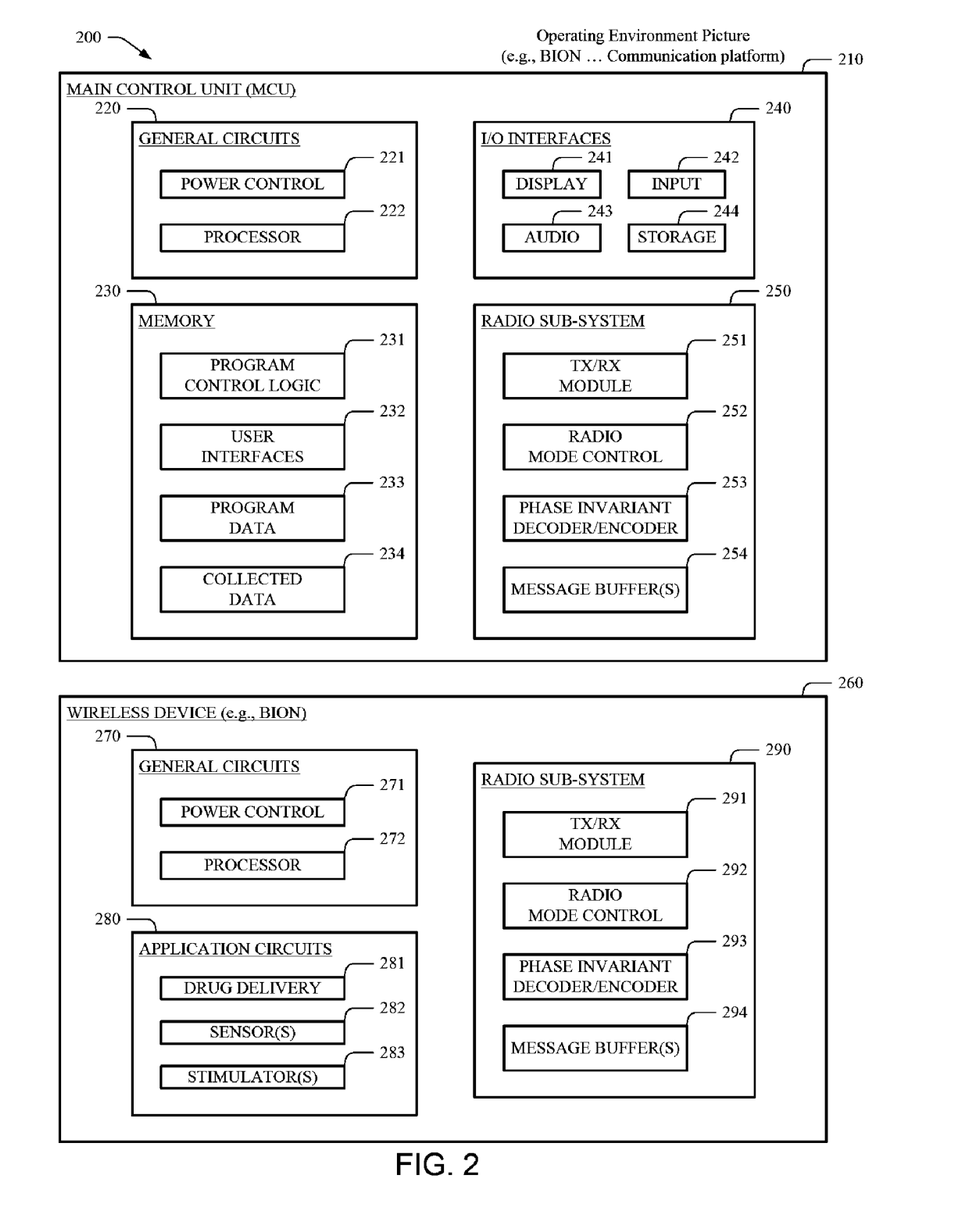
FIG. 2 is an illustration of an example main control unit (MCU) and an example wireless device that are both arranged to operate in accordance with the present disclosure.

FIG. 2 is an illustration various electronic systems (200) that may be employed by an example MCU (210) and/or an example wireless device (260) such as a bion. The MCU is illustrated as having four main functional partitions, namely, general circuits (220), a memory (230), I/O interfaces (240), and a radio sub-system (250). The general circuits (220) include power control functions (221) and processor functions (222). The memory (230) may be include both volatile memory and non-volatile memory types as may be required in a particular application, and includes storage for application program control logic (231), user interfaces (232), program data (233), and collected data (234). The I/O interfaces (240) may include analog and/or digital circuits that include functional mechanisms for a display (241), an input (242), an audio (243), and a storage (244). The radio sub-system includes functions for a transmitter/receiver or TX/RX module (251), a radio mode control (252), a phase invariant decoder/encoder (253) and one or more message buffers (254). Although described above in terms of various partitions, one or more of the functional partitions can be combined and/or separated into other physical and/or functional partitions.

The wireless device (260) is illustrated as having three main functional partitions, namely, general circuits (270), application circuits (280), and a radio sub-system (290). The general circuits (260) include power control functions (261) and processor functions (262). Memory (not shown) may be necessary for operation of the processor (272) similar to that previously described. The application circuits (280) may include one or more drug delivery circuits (261), sensor circuits (282), and/or stimulator circuits (283). The radio sub-system (290) includes functions for a transmitter/receiver or TX/RX module (291), a radio mode control (292), a phase invariant decoder/encoder (293) and one or more message buffers (294). Although described above in terms of various partitions, one or more of the functional partitions can be combined and/or separated into other physical and/or functional partitions.

The radio sub-system in the MCU (210) and in the wireless device (260) are arranged to encode and decode radio transmissions with the phase invariant decode/encoder (253) as will be described in detail later in the present disclosure.

The MCU (210) can be configured to operate in body implanted applications or in non-implanted applications as previously described. The wireless device (260) can transmit control messages via the radio sub-system (240) and process the received messages (e.g., sensory data, etc.) via the processor (232), utilizing programs and user interfaces that are available in the memory (230). In some applications, sensory data is stored in the memory (230) as the collected data (234). In other instances, the MCU (210) is arranged transmit additional control messages to one or more wireless devices (260) to activate various stimulators (e.g., 283) or drug delivery mechanisms (281) in response to the processed sensory data. The power control circuits (231) can be used to monitor and conserve power in body implanted applications of the MCU (210) by powering down various unnecessary circuit functions, and waking various circuit functions either in response to a received message indicating a sensory event, or in response to a predetermined wake-up time interval.

The wireless device (260) can be configured to operate as a bion such as in body implanted applications or in a non-implanted application such as wearable micro-transponder in a locator system. The wireless device (260) can receive control messages from the MCU (210) via the radio sub-system (290) and process the control messages via the processor (272). In response to the control messages, the wireless device (260) can activate any necessary application circuits (280) to collect sensory data via the sensors (282), or deliver drugs via the drug delivery devices (281), or stimulate muscular and/or neural activity with the stimulator devices (283). Sensory data can then be communicated back to the MCU with the radio system (290). The power control circuits (271) can be used to monitor and conserve power in such body implanted applications by powering down various unnecessary circuit functions, and waking various circuit functions either in response to a control message, in response to a sensory event, or in response to a predetermined wake-up time interval.

Examples of processor circuits include both general processing devices and application specific circuits (ASICs). Examples of general processing devices include micro-processors, micro-controllers, and digital signal processing (DSP) processors. Such processors may be complex instruction set computer (CISC) based processor devices or reduced instruction set computer (RISC) based processors. In some instances the processing functions can be provided by a programmable logic device or PLD such as a generic array logic or gate array logic (GAL) device, a programmable electrically erasable logic (PEEL) device, a complex PLD (CPLD), and a field-programmable gate array logic (FPGA) device, to name a few.

Examples of volatile memory include random access memory (RAM), dynamic random access memory (DRAM), a synchronous dynamic random access memory (SDRAM), a double-data rate SDRAM (DDR SDRAM, DDR2 SDRAM, etc.), to name a few. Examples of non-volatile memory include read only memory (ROM), programmable read only memory (PROM), erasable PROM (EPROM), electrically erasable PROM (EEPROM), static random access memory (SRAM), and flash-type memory, to name a few.

Rotational Phase Invariance Coding Methods

Golay codes are linear block-based error correcting codes that can be very useful in a communication system. There are two closely related error-correcting codes known as binary Golay codes. The extended binary Golay code encodes 12-bits of data in a 24-bit word in such a way that any triple-bit error can be corrected and any quadruple-bit error can be detected. The other, the perfect binary Golay code, has codewords of length 23 and is obtained from the extended binary Golay code by deleting one coordinate position. The extended binary Golay code can be obtained from the perfect binary Golay code by adding a parity bit. In mathematical terms, the extended binary Golay code consists of a 12-dimensional subspace W of the vector space V of 24-bit words. Any two distinct elements of W differ in at least eight coordinates or, equivalently, such that any non-zero element of W has at least eight non-zero coordinates. The possible sets of non-zero coordinates as w ranges over W are called code words. In the extended binary Golay code, all code words have Hamming weight of 0, 8, 12, 16, or 24.

The extended binary Golay code can be used to encode 12 message bits into a 24-bit code word. The extended binary Golay code has parameters of (24, 12, 8), meaning that it is a half rate code with a distance of 8. Since the extended binary Golay code is a linear block code, the 24-bit code word can be systematically divided into 12-bits of data bits and 12-bits of parity bits.

Wireless communication devices that are contemplated by the present disclosure ideally consume very little power. Since power consumption is typically highest during transmission and reception, the transceiver module in the wireless device should be operated for as little time as possible. Short burst signaling methods are preferred so that the transmit power consumption and the receive power consumption are minimal. Ideally, a short burst message payload will be transmitted without any phase reference signal since a phase reference signal generally requires a significant amount of overhead such as preambles, etc. However, the rotational phase of a received signal before demodulation can have an arbitrary rotational phase that can lead to ambiguities or errors upon receipt. For example, in a QPSK transmission system the rotational phase associated with a received signal after demodulation can be in any one of four quadrants (0°-90°, 90°-180°, 180°-270°, and 270°-360°). With the use of reference symbols, the four-way ambiguity in rotational phase can be resolved.

Without transmitting a phase reference, no unique result can be decoded from the extended binary Golay code since we have an ambiguity in the phase angle of received symbols. For a QPSK transmission system, the ambiguity is a four way ambiguity since there are four possible quadrants for the transmitted phase angle. When data is encoded with a 24-bit code as data bits D0 through D23, where half of the bits (12-bits) are coded on the in-phase axis (I) and the other half of the bits (12-bits) are coded on the quadrature-phase axis (Q), the four way ambiguity can be expressed as follows below.

| Rotational Phase Angle | I Data | Q Data |
|---|---|---|
| 0 degrees | D23:D12 | D11:D0 |
| 90 degrees | −(D11:D0) | D23:D12 |
| 180 degrees | −(D23:D12) | −(D11:D0) |
| 270 degrees | D11:D0 | −(D23:D12) |

As illustrated above, original data is transmitted as code word D23:D0. The transmitted data is received by a receiver, which then demodulates the received signal to generate received data. The rotational phase of the received signal has a four way ambiguity in the rotational phase prior to demodulation. The received data could be recovered if the rotational phase angle for the received signal is known. However, since no phase reference is transmitted another mechanism must be used to recover the data. The four-way ambiguity in the rotational phase angle is manifested as rotational transformation in the recovered I data and the recovered Q data from the received signal are rotated as illustrated in the above table.

One useful property of linear block codes is that the bitwise exclusive OR of any two valid codewords is also a valid codeword. For example, the extended binary Golay code is a linear block code in which all "1"s is a valid code, and thus the exclusive OR of the all 1's codeword is also a valid codeword. The generator or parity check matrices for a linear block code are used to define the code, and typically consist of a piece of an identity matrix and another piece that defines the parity bit generation process. The non-identify piece of the generator and parity matrices are transposes of one another.

The dual of a code is the code formed by exchanging the generator and parity check matrices. A self dual code is one where the generator and parity check matrices are the same. Only half rate codes can be self dual since the generator matrix is sized as K×N, where K is the number of bits to be encoded, and N is the code-word length. The parity check matrix is sized as (N−K)×N. The non-identity portion of the generator matrix is self transpose, meaning that it is unchanged when the rows are changed to columns and vice-versa. It is important to note that the ordinary Golay code with K=12 and (N−K)=11 is not a self dual code. The 24-bit extended Golay code (24, 12) has a generator matrix (g) and a parity check matrix (h) that are given by:

$$g = \begin{bmatrix} 1 & 0 & 0 & 0 & 0 & 0 & 0 & 0 & 0 & 0 & 0 & 0 & 1 & 1 & 0 & 1 & 1 & 1 & 0 & 0 & 0 & 1 & 0 & 1 \\ 0 & 1 & 0 & 0 & 0 & 0 & 0 & 0 & 0 & 0 & 0 & 0 & 1 & 0 & 1 & 1 & 1 & 0 & 0 & 0 & 1 & 0 & 1 & 1 \\ 0 & 0 & 1 & 0 & 0 & 0 & 0 & 0 & 0 & 0 & 0 & 0 & 1 & 1 & 1 & 0 & 0 & 0 & 1 & 0 & 1 & 1 & 1 & 1 \\ 0 & 0 & 0 & 1 & 0 & 0 & 0 & 0 & 0 & 0 & 0 & 0 & 1 & 1 & 1 & 0 & 0 & 0 & 1 & 0 & 1 & 1 & 0 & 1 \\ 0 & 0 & 0 & 0 & 1 & 0 & 0 & 0 & 0 & 0 & 0 & 0 & 1 & 1 & 0 & 0 & 0 & 1 & 0 & 1 & 1 & 0 & 1 & 1 \\ 0 & 0 & 0 & 0 & 0 & 1 & 0 & 0 & 0 & 0 & 0 & 0 & 1 & 0 & 0 & 0 & 1 & 0 & 1 & 1 & 0 & 1 & 1 & 1 \\ 0 & 0 & 0 & 0 & 0 & 0 & 1 & 0 & 0 & 0 & 0 & 0 & 0 & 0 & 1 & 0 & 1 & 1 & 0 & 1 & 1 & 1 & 1 & 1 \\ 0 & 0 & 0 & 0 & 0 & 0 & 0 & 1 & 0 & 0 & 0 & 0 & 0 & 1 & 0 & 1 & 1 & 0 & 1 & 1 & 1 & 1 & 0 & 1 \\ 0 & 0 & 0 & 0 & 0 & 0 & 0 & 0 & 1 & 0 & 0 & 0 & 0 & 1 & 0 & 1 & 1 & 0 & 1 & 1 & 1 & 0 & 0 & 1 \\ 0 & 0 & 0 & 0 & 0 & 0 & 0 & 0 & 0 & 1 & 0 & 0 & 1 & 0 & 1 & 1 & 0 & 1 & 1 & 1 & 0 & 0 & 0 & 1 \\ 0 & 0 & 0 & 0 & 0 & 0 & 0 & 0 & 0 & 0 & 1 & 0 & 0 & 1 & 1 & 0 & 1 & 1 & 1 & 0 & 0 & 0 & 1 & 1 \\ 0 & 0 & 0 & 0 & 0 & 0 & 0 & 0 & 0 & 0 & 0 & 1 & 1 & 1 & 1 & 1 & 1 & 1 & 1 & 1 & 1 & 1 & 1 & 0 \end{bmatrix}$$

and $$h = \begin{bmatrix} 1 & 1 & 0 & 1 & 1 & 1 & 0 & 0 & 0 & 1 & 0 & 1 & 1 & 0 & 0 & 0 & 0 & 0 & 0 & 0 & 0 & 0 & 0 & 0 \\ 1 & 0 & 1 & 1 & 1 & 0 & 0 & 0 & 1 & 0 & 1 & 1 & 0 & 1 & 0 & 0 & 0 & 0 & 0 & 0 & 0 & 0 & 0 & 0 \\ 0 & 1 & 1 & 1 & 0 & 0 & 0 & 1 & 0 & 1 & 1 & 1 & 0 & 0 & 1 & 0 & 0 & 0 & 0 & 0 & 0 & 0 & 0 & 0 \\ 1 & 1 & 1 & 0 & 0 & 0 & 1 & 0 & 1 & 1 & 0 & 1 & 0 & 0 & 0 & 1 & 0 & 0 & 0 & 0 & 0 & 0 & 0 & 0 \\ 1 & 1 & 0 & 0 & 0 & 1 & 0 & 1 & 1 & 0 & 1 & 1 & 0 & 0 & 0 & 0 & 1 & 0 & 0 & 0 & 0 & 0 & 0 & 0 \\ 1 & 0 & 0 & 0 & 1 & 0 & 1 & 1 & 0 & 1 & 1 & 1 & 0 & 0 & 0 & 0 & 0 & 1 & 0 & 0 & 0 & 0 & 0 & 0 \\ 0 & 0 & 0 & 1 & 0 & 1 & 1 & 0 & 1 & 1 & 1 & 0 & 0 & 0 & 0 & 0 & 0 & 0 & 1 & 0 & 0 & 0 & 0 & 0 \\ 0 & 0 & 1 & 0 & 1 & 1 & 0 & 1 & 1 & 1 & 0 & 1 & 0 & 0 & 0 & 0 & 0 & 0 & 0 & 1 & 0 & 0 & 0 & 0 \\ 0 & 1 & 0 & 1 & 1 & 0 & 1 & 1 & 1 & 0 & 0 & 1 & 0 & 0 & 0 & 0 & 0 & 0 & 0 & 0 & 1 & 0 & 0 & 0 \\ 1 & 0 & 1 & 1 & 0 & 1 & 1 & 1 & 0 & 0 & 0 & 1 & 0 & 0 & 0 & 0 & 0 & 0 & 0 & 0 & 0 & 1 & 0 & 0 \\ 0 & 1 & 1 & 0 & 1 & 1 & 1 & 0 & 0 & 0 & 1 & 1 & 0 & 0 & 0 & 0 & 0 & 0 & 0 & 0 & 0 & 0 & 1 & 0 \\ 1 & 1 & 1 & 1 & 1 & 1 & 1 & 1 & 1 & 1 & 1 & 0 & 0 & 0 & 0 & 0 & 0 & 0 & 0 & 0 & 0 & 0 & 0 & 1 \end{bmatrix}$$

The left hand side of matrix g is identical to the right hand side of matrix h, and vice-versa. In other words, the 12 right hand columns of the generator matrix (g) are the same as the 12 left hand columns of the parity matrix (h). Some interesting observations have been made that have lead to an interesting method for applying the extended binary Golay code to communication applications such that code messages are rotationally invariant.

The right hand side of the generator matrix, or the sub-matrix is shown below:

$$\begin{bmatrix} 1 & 1 & 0 & 1 & 1 & 1 & 0 & 0 & 0 & 1 & 0 & 1 \\ 1 & 0 & 1 & 1 & 1 & 0 & 0 & 0 & 1 & 0 & 1 & 1 \\ 0 & 1 & 1 & 1 & 0 & 0 & 0 & 1 & 0 & 1 & 1 & 1 \\ 1 & 1 & 1 & 0 & 0 & 0 & 1 & 0 & 1 & 1 & 0 & 1 \\ 1 & 1 & 0 & 0 & 0 & 1 & 0 & 1 & 1 & 0 & 1 & 1 \\ 1 & 0 & 0 & 0 & 1 & 0 & 1 & 1 & 0 & 1 & 1 & 1 \\ 0 & 0 & 0 & 1 & 0 & 1 & 1 & 0 & 1 & 1 & 1 & 1 \\ 0 & 0 & 1 & 0 & 1 & 1 & 0 & 1 & 1 & 1 & 0 & 1 \\ 0 & 1 & 0 & 1 & 1 & 0 & 1 & 1 & 1 & 0 & 0 & 1 \\ 1 & 0 & 1 & 1 & 0 & 1 & 1 & 1 & 0 & 0 & 0 & 1 \\ 0 & 1 & 1 & 0 & 1 & 1 & 1 & 0 & 0 & 0 & 1 & 1 \\ 1 & 1 & 1 & 1 & 1 & 1 & 1 & 1 & 1 & 1 & 1 & 0 \end{bmatrix}$$

This sub-matrix is a self transpose matrix, and the XOR of any two words in the sub-matrix has a doubly-even weight less two, meaning six or ten. Interestingly, there is only one sub-matrix row with eleven ones, and eleven of the rows have a weight of seven. Each weight seven row shares four ones with other weight seven rows, and the weight eleven row shares six ones with the other rows. A result of these described characteristics is that row or column products where the rows are the same (the main diagonal) will have an odd weight, and off diagonal products have an even weight.

The product of the sub-matrix by itself corresponds to:

$$\begin{bmatrix} 7 & 4 & 4 & 4 & 4 & 4 & 4 & 4 & 4 & 4 & 4 & 6 \\ 4 & 7 & 4 & 4 & 4 & 4 & 4 & 4 & 4 & 4 & 4 & 6 \\ 4 & 4 & 7 & 4 & 4 & 4 & 4 & 4 & 4 & 4 & 4 & 6 \\ 4 & 4 & 4 & 7 & 4 & 4 & 4 & 4 & 4 & 4 & 4 & 6 \\ 4 & 4 & 4 & 4 & 7 & 4 & 4 & 4 & 4 & 4 & 4 & 6 \\ 4 & 4 & 4 & 4 & 4 & 7 & 4 & 4 & 4 & 4 & 4 & 6 \\ 4 & 4 & 4 & 4 & 4 & 4 & 7 & 4 & 4 & 4 & 4 & 6 \\ 4 & 4 & 4 & 4 & 4 & 4 & 4 & 7 & 4 & 4 & 4 & 6 \\ 4 & 4 & 4 & 4 & 4 & 4 & 4 & 4 & 7 & 4 & 4 & 6 \\ 4 & 4 & 4 & 4 & 4 & 4 & 4 & 4 & 4 & 7 & 4 & 6 \\ 4 & 4 & 4 & 4 & 4 & 4 & 4 & 4 & 4 & 4 & 7 & 6 \\ 6 & 6 & 6 & 6 & 6 & 6 & 6 & 6 & 6 & 6 & 6 & 11 \end{bmatrix}$$

When the above sub-matrix product is reduced by modulo 2, the identity matrix is formed, indicating that the sub-matrix is self-inverse.

The above described extended binary Golay code can be used to code message data in a QPSK transmission. The message data can be mapped to 12 QPSK symbols, which corresponds to 12 in-phase (I) symbols and 12 quadrature-phase (Q) symbols. For example, 12-bit message data can be mapped to the 12-symbols of the I channel, and 12-bit parity data can be mapped to 12-symbols of the Q channel. However, similar to previously discussed, a 90 degree phase rotation between the I and Q channels still results in a phase ambiguity, where either the data appears on the Q channel as −data with the parity on the I channel, or the data appears on the Q channel with the parity on the I channel as −parity.

The extended binary Golay coding methods described above are still not rotationally invariant, but the coding method can be adapted with a phase rotationally invariant coding scheme. Ideally, all of the bits are arranged so that a 90 degree rotation of the QPSK signal is equivalent to an exclusive OR operation on the transmitted data by a valid codeword. Once the bits are so arranged, the self inverse property of the matrices can be used to exchange the bits to recover data and parity. The bit arrangement is determined by a weight 12 codeword.

In a system that uses 10-bit data for the message payload, each 10-bit number is mapped into a 12-bit data space. In one example, the 10-bit to 12-bit mapping is accomplished with a look-up-table (LUT). In another example, the 10-bit number is padded with two bits prior to mapping into 12-bit space with the LUT. It is not important as to which two bits are padded, but it is simplest to place two leading zeros to the left of the most significant bit in the 10-bit number. Once the data is mapped into the 12-bit space the parity information is generated using an extended binary Golay encoding matrix as previously described. Next, we identify bits in the data field and bits in the parity field to swap. The bits that are selected for swapping are based on a weight 12 codeword that is arranged along a single axis (i.e., I or Q for a QPSK system) so that recovery of the data can be simplified.

Once the bit swapping is completed, 90 degree phase rotations are equivalent to an exclusive OR operation by a valid codeword, and an exchange of the data and parity bits. Once the encoded data is captured by a receiver, the reverse operation can be used to recover the original 10-bit data.

Ideally, all data would be aligned in the data space along a single axis by using a codeword such as FFF000-hex, which corresponds to the binary sequence [1111 1111 1111 0000 0000 0000]. However, FFF000-hex is not a valid codeword and is thus not available. Instead, a weight 12 template code is selected for mapping the data, and the appropriate bit fields are identified using for the weight 12 template code to swap selected bit fields. 7FF800-hex is a valid codeword, which corresponds to the binary sequence: [0111 1111 1111 1000 0000 0000]. Notice that the 7FF800-hex codeword can be converted into a bit pattern that corresponds to FFF000-hex by simply swapping the most significant bit of the "7FF" portion of the codeword with the most significant bit of the "800" portion of the codeword.

In one example, the input data has a value of 56, which is a 10-bit binary sequence corresponding to: [00 0011 1000]. Two leading zeros are then added to the beginning of the 10-bit binary sequence to provide a 12-bit binary sequence that corresponds to: [0000 0011 1000]. The 12-bit binary sequence is then mapped into a code by converting the 12-bit binary sequence into a 24-bit code using the binary extended Golay Code. The 24-bit code corresponds to: [1000 0011 0101 0000 0011 1000], where 12-bits correspond to data and 12-bits correspond to parity. The most significant bits are swapped so that 7FF800-hex code space can be mapped into FFF000-hex code space, providing the following 24-bit result: [0000 0011 0101 1000 0011 1000]. Once the 24-bit coded word is transmitted, the rotational phase of the received signals at the receiver can be any arbitrary rotation. The receiver is arranged to capture samples from the I and Q signals, where the samples are associated with receiver bit values that can be designated as RX Q bits and RX I bits. The table that is provided below illustrates an example of the effect on the RX Q bits and the RX I bits that result from the ambiguity in the rotational phase angle of the received signal.

| Receiver Rotational Phase Angle | RX Q Bits | RX I Bits |
|---|---|---|
| 0 degrees | 0000 0011 0101 | 1000 0011 1000 |
| 90 degrees | 0111 1100 0111 | 0000 0011 0101 |
| 180 degrees | 1111 1100 1010 | 0111 1100 0111 |
| 270 degrees | 1000 0011 1000 | 1111 1100 1010 |

After the symbols above are received, the most significant bits should be swapped back into their original positions, yielding the following results, which are all valid codewords:

| Received Phase Angle | Q Bits (Parity) | I Bits (Data) |
|---|---|---|
| 0 degrees | 1000 0011 0101 | 0000 0011 1000 |
| 90 degrees | 0111 1100 0111 | 0000 0011 0101 |
| 180 degrees | 0111 1100 1010 | 1111 1100 0111 |
| 270 degrees | 1000 0011 1000 | 1111 1100 1010 |

Using the above described procedure, all data values are mapped to 4 codewords so that regardless of the phase rotation angle, the data can be recovered. A reverse look-up table can be used to retrieve the original data [0000 0011 1000] by indexing any one of the four identified codes.

Example Transmitter Block with Phase Invariant Encoding

Figure 3:
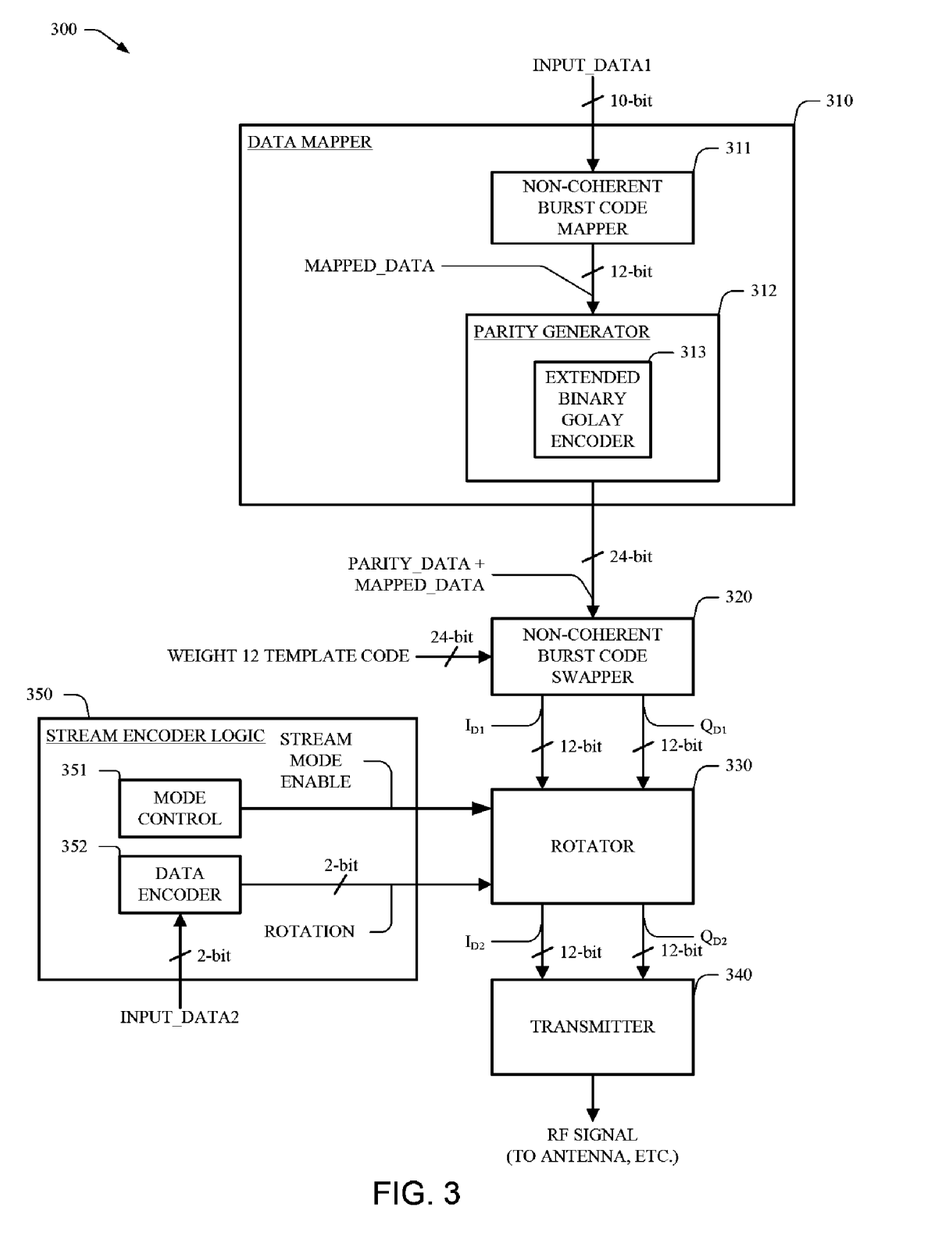
FIG. 3 is an illustration of an example transmitter block that is arranged according to at least one aspect of the present disclosure.

FIG. 3 is an illustration of an example transmitter block (300) that is arranged according to at least one aspect of the present disclosure. Transmitter block 300 includes a data mapper (310), a non-coherent burst code swapper (320), a rotator (330), a transmitter (340), and stream encoder logic (330). The example data mapper (310) further includes a non-coherent burst code mapper (313) and a parity generator (312). The example stream encoder logic further comprises a mode control (351) and a data encoder (352).

In operation an input data (INPUT_DATA1) is provided to the data mapper (310) as a 10-bit data. The data mapper (310) is arranged to provide a 24-bit quantity that corresponds to 12-bits of parity information and 12-bits of remapped data. For the example illustrated in FIG. 3, the data mapper uses a non-coherent burst code mapper (311) to generate the 12-bits of mapped data (MAPPED_DATA) from the 10-bit input data (INPUT_DATA1). MAPPED_DATA is provided to the parity generator (312), which uses the extended binary Golay encoder (313) to generate the 12-bits of parity data (PARITY_DATA). The parity data (PARITY_DATA) and the remapped data (MAPPED_DATA) together form an extended Golay code that is received by the non-coherent burst code swapper (320). Although described below as separate functional blocks, the non-coherent burst code mapper (311) and the parity generator (312) can be implemented as a single functional block without departing from the spirit of the present disclosure.

The non-coherent burst code mapper (311) is arranged to map a 10-bit data value that ranges in value from 0-1023, to a 12-bit value that ranges in value from 0-4095. The 12-bit values in the mapped data (MAPPED_DATA) are encoded in the form of a Golay code. In one example implementation, the non-coherent burst code mapper (311) is simply a look-up table that is indexed by the 10-bit data value or a generator matrix that is applied to the 10-bit data value to identify a 12-bit Golay code for the input data (INPUT_DATA1). In another example implementation, the 10-bit value is padded with two extra bits, and then the 12-bit quantity is encoded with either a look-up table (LUT). The 2-bits that are padded to the 10-bit value can be placed in any designated bit position and have any designated value, but for convenience it is easiest to add either two leading zeros or two trailing zeros to the 10-bit value.

The parity generator (312) is arranged to generate parity data by generating parity data (PARITY_DATA) for the mapped data (MAPPED_DATA), which is in the form of a Golay code. The 12-bit parity data is generated using an extended binary Golay encoder (313), so that the parity data taken together with the mapped data form a 24-bit extended Golay code. The extended binary Golay encoder (313) can be implemented as a look-up table that is indexed by the mapped data (MAPPED_DATA).

The non-coherent burst code swapper (320) receive the parity data (PARITY_DATA) and the mapped data (MAPPED_DATA), which is a 24-bit extended binary Golay code, and generates two 12-bit values, where one 12-bit value is the in-phase data ($I_{D1}$) and the other 12-bit value is the quadrature-phase data ($Q_{D1}$). The in-phase and quadrature-phase data values are generated by identifying the appropriate bit fields of the parity data and the mapped data to remove the rotational sensitivity of the data, and then swap the values for the identified bit fields so that the resulting swapped data corresponds to a pattern which is 90 degree rotationally insensitive. In other words, the resulting swapped data is a 24-bit pattern in which, if the template codeword is sent to the input, the output on the I channel is an inverse of the Q channel (e.g., the I channel data is all ones and the Q channel data is all zeros, or vice-versa). The swapped bit fields can be determined from a 24-bit weight 12 template code, where a first 12-bits of the weight 12 template code can be used to identify bit positions of the parity data, and where a second 12-bits of the weight 12 template code can be used to identify bit positions of the mapped data. Once the identified bit positions are swapped, the resulting in-phase data ($I_{D1}$) and quadrature-phase data ($Q_{D1}$) will be a phase rotation invariant code.

The rotator (330) receives the 24-bit coded signal that corresponds to the in-phase data ($I_{D1}$) and quadrature-phase data ($Q_{D1}$) from the non-coherent burst code swapper (320), and cooperates with the stream encoder logic (350) to provide a second 24-bit coded signal that corresponds to a second 12-bit in-phase data ($I_{D2}$) and a second quadrature-phase data ($Q_{D2}$). The stream encoder logic (350) includes a mode control block (351) and a data encoder block (352). When the stream mode is enabled by the mode control block (351), two additional input data bits (INPUT_DATA2) can be encoded into the signal transmission as a 2-bit rotation (e.g., 00=0 degrees, 01=90 degrees, 10=180 degrees, and 11=270 degrees). The rotator is enabled by the stream mode enable signal to process the 24-bit coded signal to provide the second 24-bit data signal to the transmitter (340) as a phase rotated version that is rotated according to the 2-bit rotation signal. When the stream mode is disabled, the rotator merely passes the 24-bit coded signal through to the transmitter (340) without modification. In implementations that do not require stream mode operation (i.e., a mode where only one 10-bit payload is transmitted without additional transmissions of 12-bit payloads), the rotator and the stream mode encoder logic can be eliminated.

The transmitter (340) is arranged to receive in-phase data ($I_{D2}$) and quadrature-phase data ($Q_{D2}$) to provide a transmission signal using techniques such as modulation, filtering, and other transmission techniques. The transmitter thus provides a transmission signal that carries the information from the 24-bit coded signal therein. Additional circuits such as antennas, frequency synthesizers, filters, TX/RX switches, and other related RF circuitry may be included in the transmitter, or provided separately.

Example Process Flow for Phase Invariant Encoding

Figure 4:
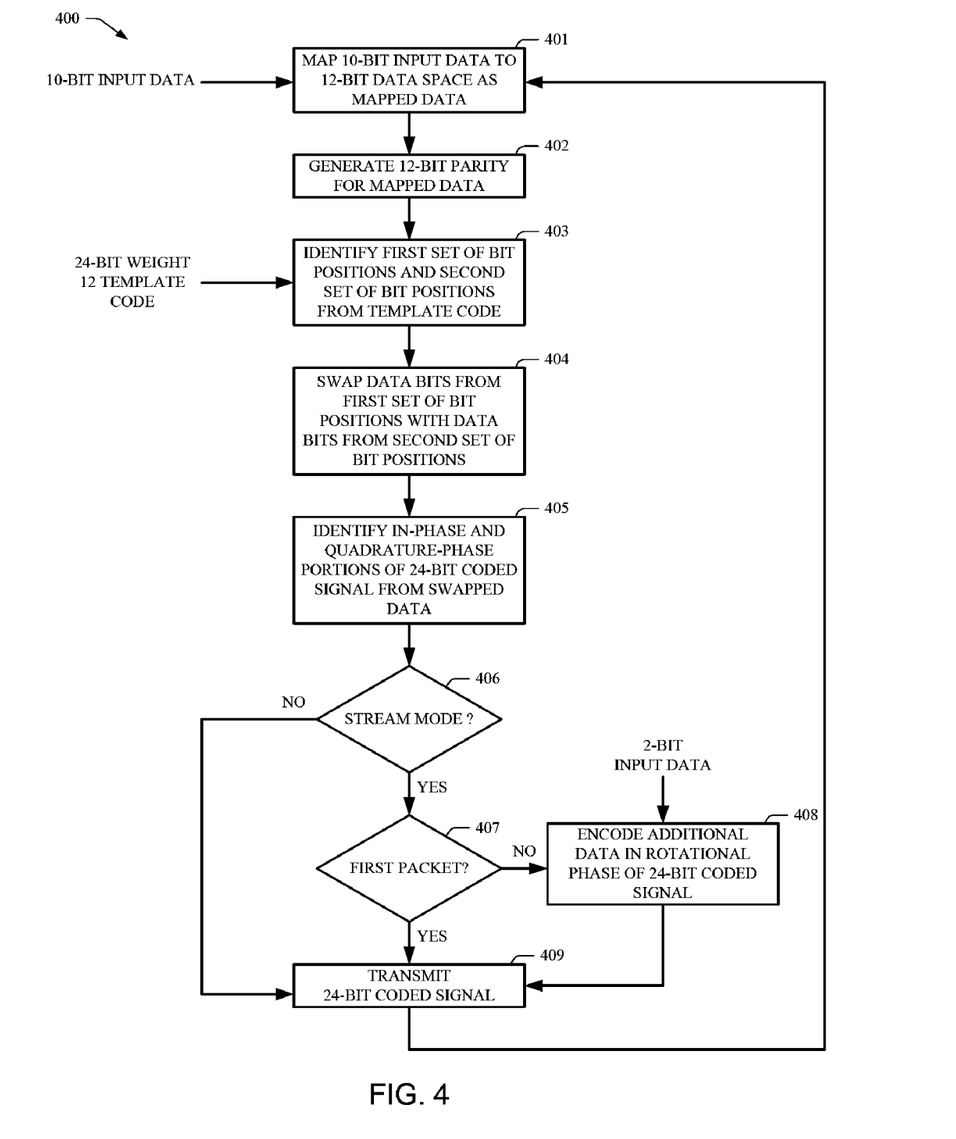
FIG. 4 is an illustration of an example process flow for coding a signal transmission according to at least one aspect of the present disclosure.

FIG. 4 is an illustration of an example process flow (400) for coding a signal transmission according to at least one aspect of the present disclosure.

Processing begins at block 401, where the 10-bit input data is mapped into a 12-bit data space. Continuing to block 402, 12-bit parity data is generated for the 12-bit data, which is the mapped 10-bit input data, using an extended binary Golay encoder. At block 403, a first and second set of bit positions are identified for the 12-bit mapped data and the 12-bit parity, respectively, using first and second portions of the 24-bit weight 12 code. Continuing to block 404, a first set of bit values occupying the first set of bit positions in the 12-bit data are swapped with a second set of bit values occupying the second set of bit positions in the 12-bit parity to provide a 24-bit coded signal. At block 405, a first 12-bit portion of the 24-bit coded signal is identified as an in-phase portion, while a second 12-bit portion of the 24-bit coded signal is identified as a quadrature-phase portion for a signal transmission.

At decision block 406, the system determines if the transmission is employing streaming technology. When streaming technology is used, processing continues to decision block 407, where the system determines if the current input data corresponds to the first packet in a transmission sequence. Processing continues to block 409 where the first packet is transmitted as a signal transmission that includes the 10-bit input data encoded via the 24-bit coded signal in the transmission. When additional packets are transmitted after the first packet, processing flows from decision block 407 to block 308 where additional data is encoded into the rotational phase of the 24-bit coded signal, and subsequently transmitted. When streaming technology is not used, processing flows to step 409 where the signal transmission again only includes the 10-bit input data encoded via the 24-bit coded signal in the transmission.

Example Receiver Block with Phase Invariant Decoding

Figure 5:
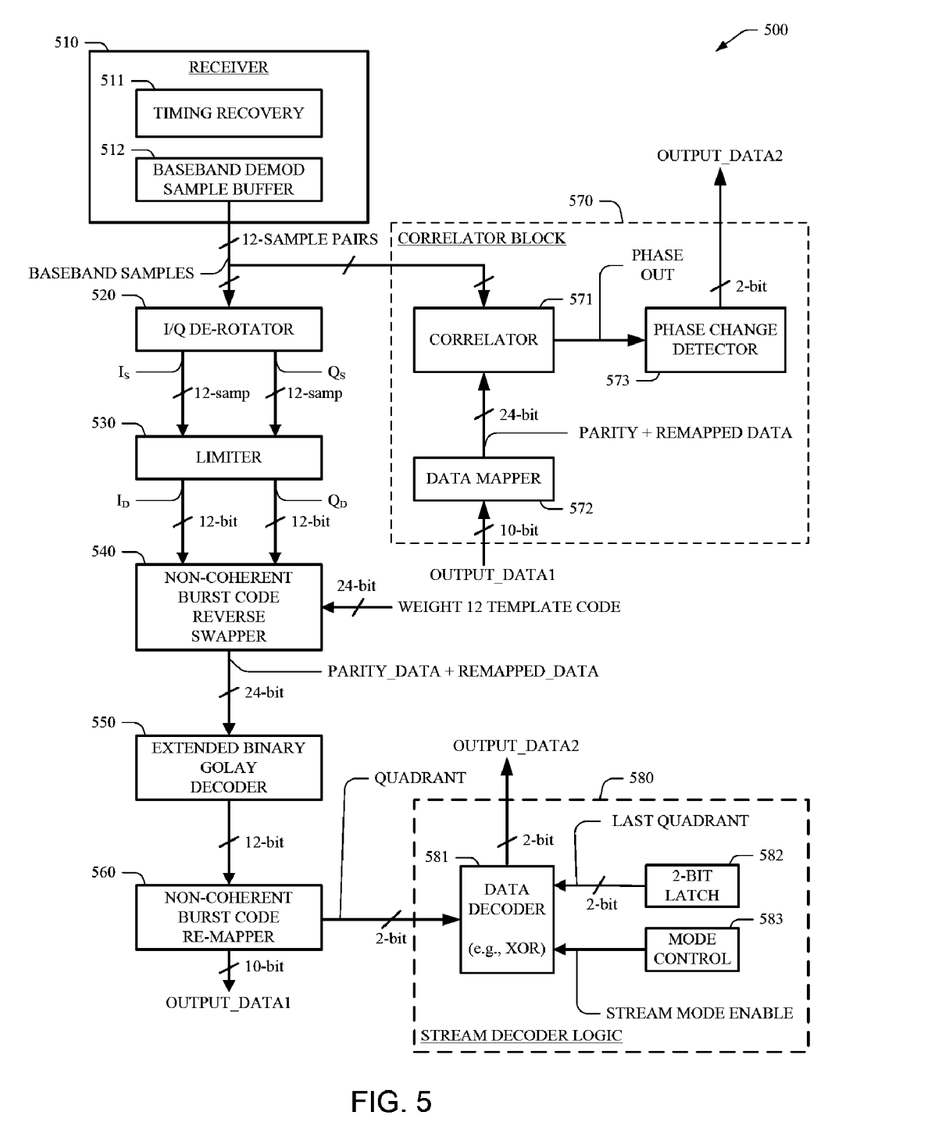
FIG. 5 is an illustration of an example receiver block that is arranged according to at least one aspect of the present disclosure.

FIG. 5 is an illustration of an example receiver block (500) that is arranged according to at least one aspect of the present disclosure. Receiver block 500 includes a receiver (510), a de-rotator (520), a limiter (530), a non-coherent burst code reverse swapper (340), an extended binary Golay decoder (550), a non-coherent burst code re-mapper (560), a correlator block (570), and a stream decoder logic (580). The example stream decoder logic further comprises a timing recovery block (511) and a baseband demodulator and sample buffer block (512).

In operation a set of baseband samples are generated by the receiver after timing recovery is completed and samples of possible symbols are recovered by the receiver (510). The baseband samples include 12-sample pairs, where each sample pair comprises one in-phase (I) sample and one-quadrature phase (Q) sample. The de-rotator (520) is arranged to process the baseband samples and generate 12 in-phase de-rotated samples ($I_S$) and 12 in-phase de-rotated quadrature-phase samples ($Q_S$). The limiter (530) is arranged to generate 12-bits of in-phase data ($I_D$) and 12-bits of quadrature-phase data ($Q_D$) by evaluating the various in-phase de-rotated samples ($I_S$) and quadrature-phase de-rotated samples ($Q_S$).

The 12-bit in-phase data ($I_D$) and 12-bit quadrature-phase data ($Q_D$) together comprise a 24-bit coded signal such as that previously described with respect to FIGS. 3 and 4. The non-coherent burst code reverse swapper (540) is arranged to process the 24-bit coded signal using the same weight 12 template code that was employed in generating the signal transmission to reverse the swapping of selected bit fields from the encoding process (see e.g., FIG. 4). The reverse swapped version of the 24-bit coded signal corresponds to a second 24-bit signal that comprises 12-bits of parity data (PARITY_DATA) and 12-bits of re-mapped data (REMAPPED_DATA).

The extended binary Golay decoder (550) is arranged to process the parity data and the re-mapped data to generate a 12-bit Golay code. The 12-bit Golay code is subsequently used to recover a 10-bit data (OUTPUT_DATA1) with the non-coherent burst code re-mapper (560). The extended binary Golay decoder is arranged to provide an inverse operation that is matched to the extended binary Golay encoder from FIG. 4. Similarly, the non-coherent burst code re-mapper is arranged to provide an inverse operation that is matched to the non-coherent burst code mapper from FIG. 4.

Streamed data transmissions are possible such as that previously described for FIGS. 3 and 4. Additional data (e.g., 2-bits of OUTPUT_DATA2) from stream encoded transmissions can be recovered either using the correlator block (570) or using the stream decoder logic (580).

For implementations that employ the correlator block (570), the correlator (571) is arranged to correlate the baseband samples against a 24-bit coded signal that is generated from the data mapper (572). The data mapper (572) is configured to generate the 24-bit coded signal as parity and remapped data from 10-bit OUTPUT_DATA1, and can simply be a look-up table or generator matrix as previously described for data mapper 310 of FIG. 3. The phase output (PHASE_OUT) of the correlator is compared to the previous phase output by the phase change detector (573) to extract the 2-bit encoded data (OUTPUT_DATA2) from the identified rotational phase of the transmitted signal.

For implementations that employ the stream decoder logic (580), the non-coherent burst code re-mapper (560) is further arranged to provide a 2-bit quadrant signal (QUADRANT) to identify the current rotational phase angle of the received signal transmission. The data decoder (581) is arranged to compare the current 2-bit quadrant signal to the quadrant of the last received quadrant signal (LAST QUADRANT) to identify the encoded data (OUTPUT_DATA2) in the rotational phase of the signal transmission. The last quadrant can be stored in a memory store such as a 2-bit latch (582), and the streaming mode can selectively enabled or disables using the mode control logic (583).

Example Process Flow for Phase Invariant Decoding

Figure 6:
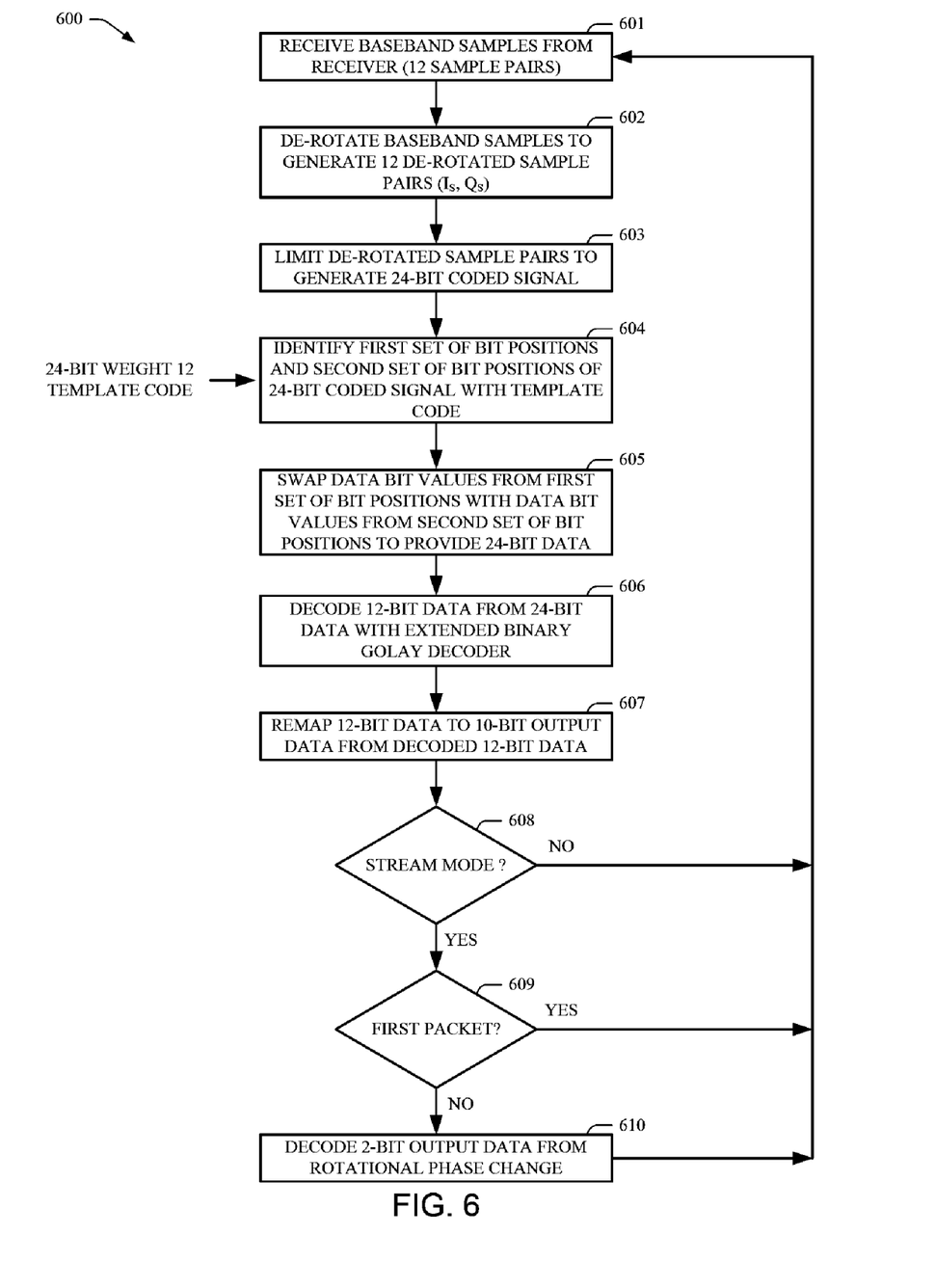
FIG. 6 is an illustration of an example process flow for decoding a signal transmission according to at least one aspect of the present disclosure.

FIG. 6 is an illustration of an example process flow (600) for decoding a signal transmission according to at least one aspect of the present disclosure. Processing begins at block 601, where baseband samples associated with a signal transmission are provided from a receiver. Continuing to block 602, a series of baseband samples (e.g., 24 samples or 12 sample pairs) are de-rotated to generate de-rotated samples for in-phase ($I_S$) and quadrature-phase ($Q_S$) portions (e.g., 12 de-rotated sample pairs). The baseband samples include a combination of signal and noise from the received signal transmission with an unknown phase rotation angle. The de-rotated series of samples (i.e., from the 12 symbols) are aligned to a nominal rotation angle that corresponds to at least one of 45 degrees, 135 degrees, 225 degrees, and 315 degrees.

Continuing to block 603, a 24-bit coded signal is generated by limiting the de-rotated series of samples. The 24-bit coded signal includes two portions correspond to a 12-bit of in-phase portion ($I_D$) and a 12-bit of quadrature-phase portion ($I_D$). Proceeding to block 604, a first set of bit positions and a second set of bit positions are identified for the 24-bit coded signal from a first portion of a 24-bit weight 12 template code and a second portion of the 24-bit weight 12 template code, respectively.

At block 605, a first set of bit values in the first set of bit positions for the 24-bit coded signal are swapped (i.e., reverse swapped relative to swapper 320 from FIG. 3) with a second set of bit values in the second set of bit positions for the 24-bit coded signal to provide a 24-bit data. The 24-bit data includes a 12-bit data portion and a 12-bit parity data portion identical in format to the parity data and mapped data that was provided by the data mapper (310) with reference to FIG. 3.

At block 606, a 12-bit data is decoded from the 24-bit data using an extended binary Golay decoder. The 12-bit data is identical in format to the 12-bit mapped data from the data mapper (310) of FIG. 3. Proceeding to block 607, the 12-bit data is remapped to a 10-bit output data, where the 12-bit data corresponds to a mapping from 10-bit data space to 12-bit data space as determined by the 24-bit weight 12 template code.

At decision block 608, the system determines if the transmission is operating in a streaming mode (if steaming technology is supported in the implementation). When streaming mode is inactive, processing resumes at block 601. Otherwise, when streaming mode is active, processing continues to decision block 609, where the system determines if the currently decoded output data corresponds to the first packet from a streamed transmission sequence. Processing also flows from decision block 609 to block 601 when streaming mode is active and the first packet of a new transmission steam is received. When additional packets are transmitted after the first packet, processing flows from decision block 609 to block 610 where additional data (e.g., 2-bit output data) is decoded from the rotational phase that is encoded in the signal transmission (e.g., encoded in the 24-bit coded signal).

Example Receiver Block with Soft Decoding

Figure 7:
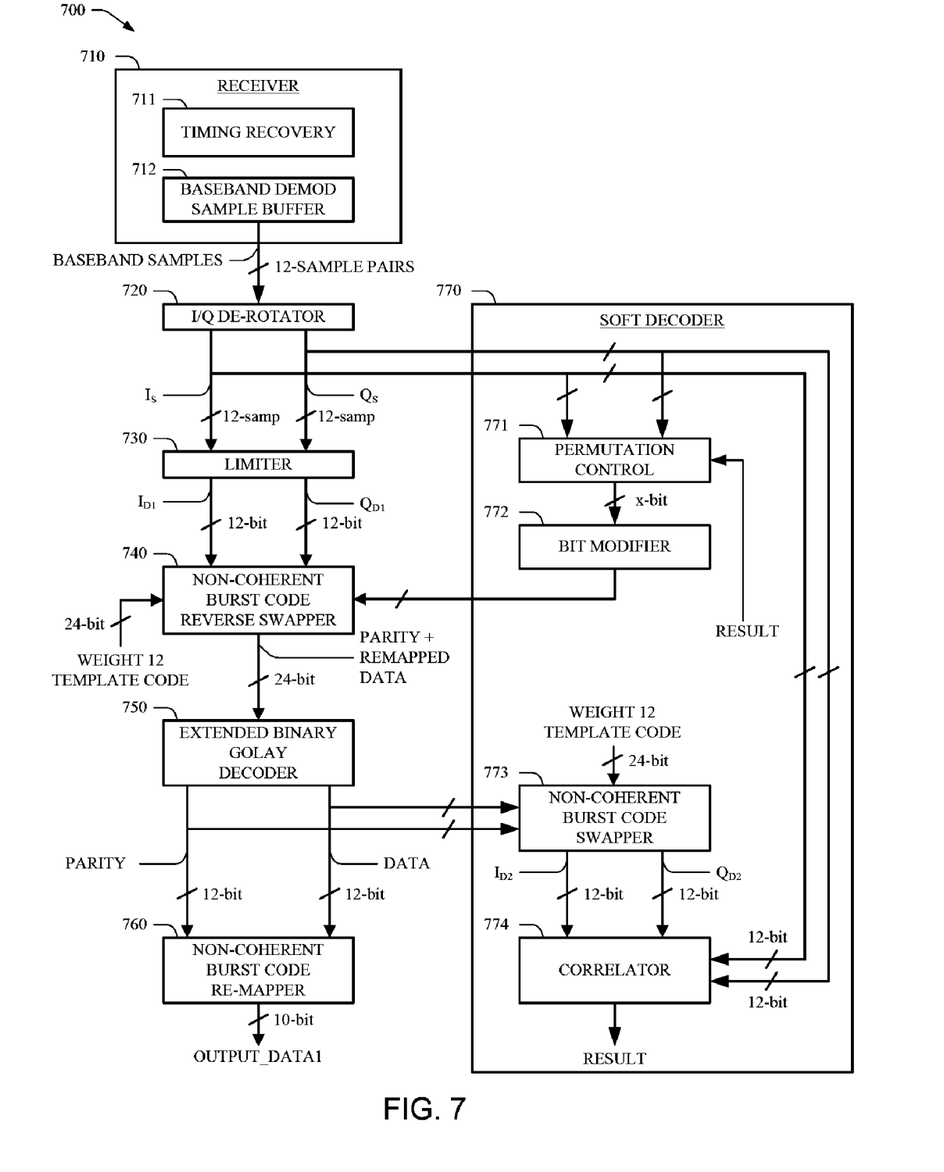
FIG. 7 is an illustration of an example receiver block that is enhanced with a soft decoding method according to at least one aspect of the present disclosure.

FIG. 7 is an illustration of an example receiver block (700) that is enhanced with a soft decoding method according to at least one aspect of the present disclosure. Receiver block 700 includes a receiver (710), a de-rotator (720), a limiter (730), a non-coherent burst code reverse swapper (740), an extended binary Golay decoder (750), a non-coherent burst code re-mapper (760), and a soft decoder block (770). The receiver block (700) may also include correlator block (see e.g., 570) and/or a stream decoder logic block (see e.g., 580) such as previously described with respect to FIG. 5.

Receiver block 700 is substantially similar in operation to receiver block 500 from FIG. 5, with the addition of a soft decoder block (770) and a modified non-coherent burst code reverse swapper (740). The soft decoder block (770) includes functions for permutation control (771), a bit modifier (772), a non-coherent burst code swapper (773), and a correlator (774).

The signal strength associated with each of the de-rotated samples ($I_S$ and $Q_S$) are ranked by the permutation control (771). The permutation control then identifies a number (x) of received symbols that have the weakest signal strengths. The permutation control then creates a list of all possible combinations of values (e.g., 32 possible permutations when x=5) that can replace the bit-values for the bit positions associated with the weakest signal strengths. The bit modifier (772) is arranged to cooperate with the non-coherent burst code reverse swapper (740) to replace the bit values for the in-phase data ($I_{D1}$) and quadrature-phase data ($Q_{D1}$) according to the bits designated by the bit modifier (772) and the permutation control (771). After the replaced bit values are decoded into parity and data by the extended binary Golay decoder (750), the values are swapped according to weight 12 template code via the non-coherent burst code swapper (773) to generate a second set of in-phase data ($I_{D2}$) and quadrature-phase data ($Q_{D2}$) that corresponds to another 24-bit data. The correlator (774) correlates the de-rotated set of symbols ($I_S$ and $Q_S$) with the second set of in-phase data ($I_{D2}$) and quadrature-phase data ($Q_{D2}$) and provides a correlation result (RESULT) to the permutation control (771). After all of the possible permutations are attempted, the permutation control identifies the highest correlation result as correct coded signal, and the output data is appropriately generated as OUTPUT_DATA1.

Example Process Flow for Soft Decoding

Figure 8:
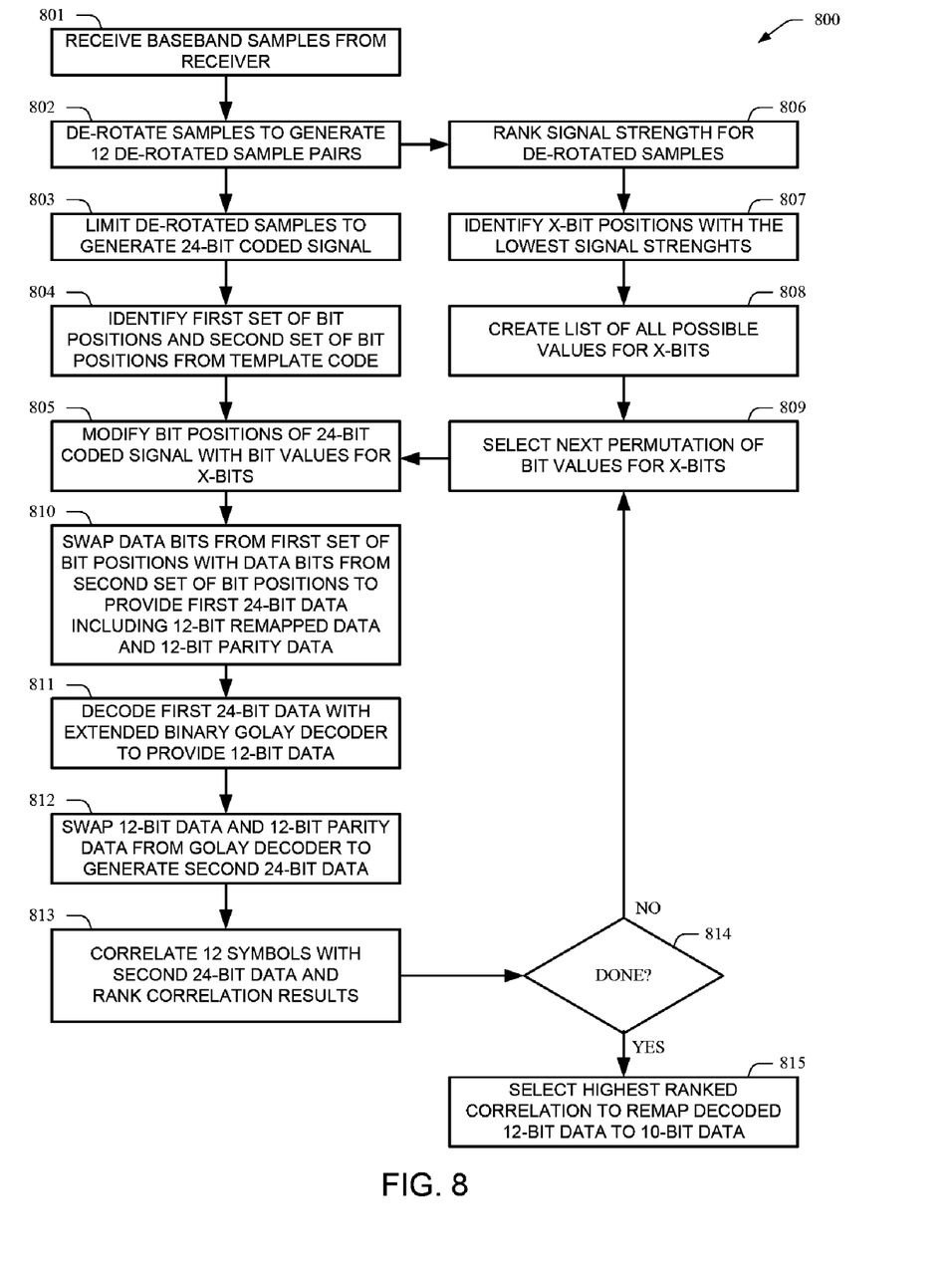
FIG. 8 is an illustration of an example process flow for decoding a data transmission with a soft decoding method according to at least one aspect of the present disclosure.

FIG. 8 is an illustration of an example process flow (800) for decoding a data transmission with a soft decoding method according to at least one aspect of the present disclosure. At block 801, baseband samples are received from the receiver. Continuing to block 802, the baseband samples are de-rotated to generate 12 de-rotated sample pairs. The 12 de-rotated sample pairs are limited to generate the 24-bit coded signal at block 803. At block 804 the first and second set of bit positions in the 24-bit coded signal are identified using the template code.

Also continuing from block 802 (in parallel with the path to block 803), the signal strengths associated with the 24 received bits are ranked at block 806. Processing continues from block 806 to block 807, where a number ("x") of bit positions associated with the lowest signal strengths for the 24 received bits are identified. A list of all possible combinations of values is created for the x-bit positions at block 808. One of the untested permutations of the bit value combinations is selected at block 809.

Blocks 804 and 809 both proceed to block 805, where the bit positions in the 24-bit coded signal are replaced with values from the selected permutation of the x-bit positions. Proceeding from block 805 to block 810, the data bits from the modified 24-bit coded signal are swapped according to the identified first and second set of bit positions at block 804 to provide a first 24-bit data, which includes a 12-bit data portion and a 12-bit parity portion. At block 811, the first 24-bit data is decoded by an extended binary Golay decoder to provide 12-bit data.

Continuing from block 811 to block 812, the 12-bit data and 12-bit parity data from the output of the extended binary Golay decoder are re-swapped to generate a second 24-bit data. Proceeding to block 813, the 12-symbols from the de-rotated samples are correlated with the second 24-bit data, and the results of the correlation are ranked. At decision block 814, the system determines if all possible permutations have been correlated and ranked. When additional permutations are necessary, processing flows from decision block 814 to block 809 where the next permutation of bit values for x-bits is selected before processing continues to block 810. When all necessary permutations have been processed, processing continues from decision block 814 to block 815, where the highest ranked correlation is identified before the appropriate remapping is performed from 12-bit data to 10-bit data.

In an alternative implementation, the soft decoder correlation described above is replaced with a correlator that does not require ranking of signal strengths. For this alternative example, the correlator is arranged such that the samples are correlated against all possible codewords (e.g., 1024 codewords for the 10-bit data) to recover the transmitted data. An example is illustrated in FIG. 5 as correlator block 570.

Example Process Flow for Generating a Data Mapper Look Up Table

Figure 9:
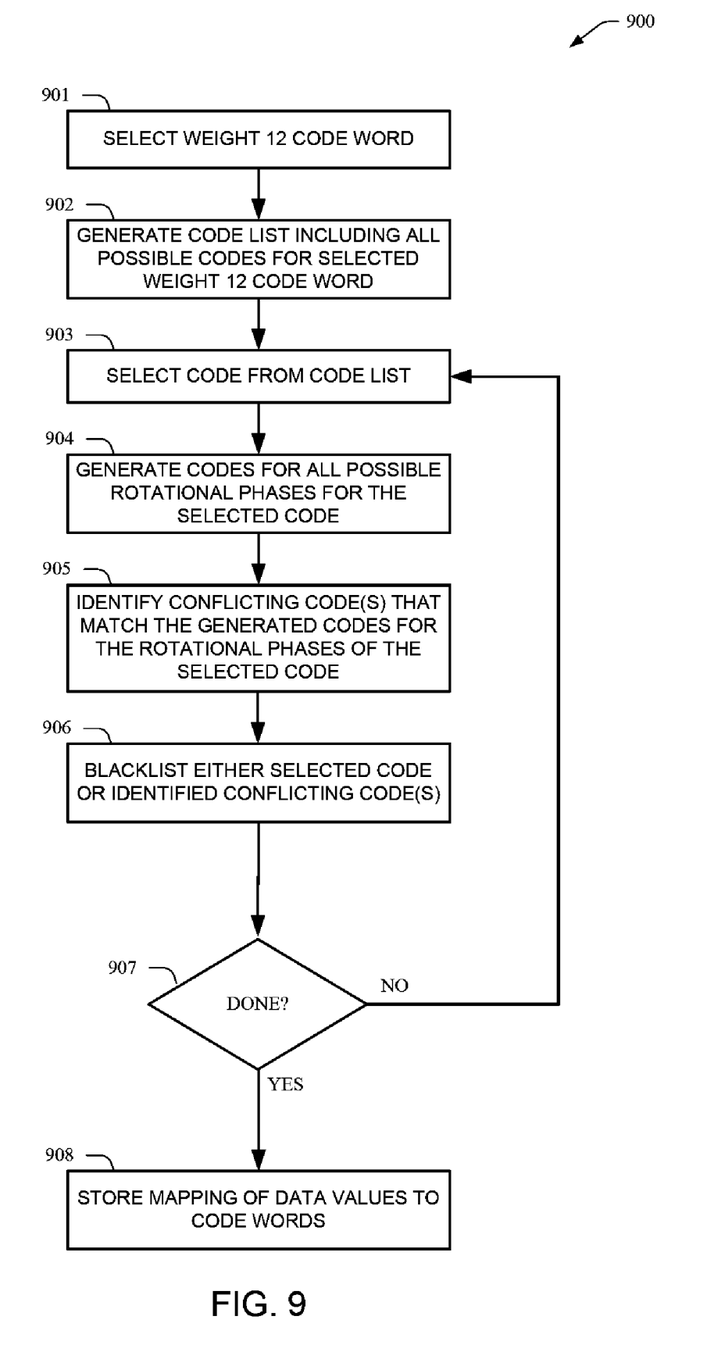
FIG. 9 is an illustration of an example process flow for generating a code mapper, generator, or look-up table in accordance with at least one aspect of the present disclosure.

FIG. 9 is an illustration of an example process flow (900) for generating a data mapper, generator, or look-up table in accordance with at least one aspect of the present disclosure. At block 901, a weight 12 code is selected. Continuing to block 902, all possible codes are generated for every possible data value using the weight 12 code, where the codes are placed in a code list. Proceeding to block 903, one of the codes from the code list is selected for evaluation. At block 904 the four possible 90 degree phase rotations of the selected code is determined. Proceeding to block 905, the codes on the code list are evaluated to identify conflicting codes, which are those codes that match the generated codes for the 90 degree rotational phases of the selected code. At block 906, either the conflicting codes are blacklisted or the selected code is blacklisted. Blacklisted codes can simply be removed from the code list, or provided in a separate list. At decision block 907, the system determines if all of the necessary codes have been processed to create an appropriate code list. When additional codes are to be processed, processing continues from decision block 907 to block 903 where another one of the available codes is selected for evaluation. When all codes have been processed, processing flows from decision block 907 to block 908 where the mapping between input data and the code list is stored such as in a look-up table, a generator matrix, a memory, or provided in a data mapper circuit.

Although the electronic systems, circuits, and methods are illustrated by various individual blocks, the scope of the present disclosure should not be interpreted as limited to these discrete blocks. One or more of the blocks may be combined or separated into other blocks that provide a similar functionality. The invention is not limited to the precise configurations and embodiments described above. Various modifications, alternatives, changes, and equivalents will be apparent to those skilled in the art and are considered within the spirit and scope of the present disclosure. Since many embodiments of the invention can be made without departing from the spirit and scope of the invention, the invention resides in the claims hereinafter appended.

What is claimed is:

1. A method for decoding information from a signal transmission that is encoded with a non-coherent burst code, the method comprising:
   derotating a series of baseband samples associated with the signal transmission into in-phase and quadrature-phase portions, wherein the series of baseband samples include a combination of signals and noise associated with the signal transmission, wherein the series of baseband samples has an unknown rotation angle, and wherein the derotated series of baseband samples are aligned to a nominal rotation angle that corresponds to at least one of 45 degrees, 135 degrees, 225 degrees, and 315 degrees;
   generating a 24-bit coded signal by hard-limiting the derotated series of baseband samples;
   identifying a first set of bit positions for a first 12-bit portion of the 24-bit coded signal from a first portion of a 24-bit weight 12 template code;
   identifying a second set of bit positions for a second 12-bit portion of the 24-bit coded signal from a second portion of the 24-bit weight 12 template code;
   swapping a first set of bit values in the first set of bit positions for the 24-bit coded signal with a second set of bit values occupying the second set of bit positions for the 24-bit coded signal to provide a 24-bit data;
   decoding a 12-bit data from the 24-bit code using an extended binary Golay decoder; and
   remapping the 12-bit data to a 10-bit output data, wherein the 12-bit data corresponds to a mapping from 10-bit data space to 12-bit data space, wherein the mapping between the 10-bit data space and the 12-bit data space is determined by the 24-bit weight 12 template code.

2. The method of claim 1, further comprising:
   identifying a first rotational phase for a first one of the 10-bit output data that is received at a first instance of time;
   identifying a second rotational phase for a second one of the 10-bit output data that is received at a second instance of time, wherein the second instance of time occurs after the first instance of time; and
   decoding a 2-bit output data at the second instance of time from a difference between the first rotational phase and the second rotational phase.

3. The method of claim 2, wherein the first rotational phase is indicated with a first quadrant signal, the second rotational phase is indicated with a second quadrant signal, and wherein decoding comprises applying an exclusive OR operation on the first quadrant signal and the second quadrant signal.

4. The method of claim 1, further comprising:
   mapping the 10-bit output data to a 24-bit code;
   correlating the 24-bit code with the series of baseband samples to provide a phase signal;
   identifying a first phase signal for a first one of the 10-bit output data that is received at a first instance of time;
   identifying a second phase signal for a second one of the 10-bit output data that is received at a second instance of time, wherein the second instance of time occurs after the first instance of time; and
   decoding a 2-bit output data at the second instance of time from a difference between the first phase signal and the second phase signal.

5. The method of claim 1, further comprising:
   ranking a signal strength associated with each bit from the derotated series of baseband samples
   identifying bit positions in the 24-bit coded signal corresponding to bits that have a lowest signal strength in the ranking;
   creating a list of all possible values for the identified bit positions;
   cycling through possible bit values for the identified bit positions until all permutations of bit values are exhausted, by:
      selecting a next permutation of bit values from the list;
      modifying the identified bit positions in the 24-bit coded signal with the selected bit values;
      reverse swapping a first set of bit values in the first set of bit positions for the 24-bit data with a second set of bit values occupying the second set of bit positions for the 24-bit data to provide a second 24-bit data; and
      correlating the second 24-bit data with the derotated series of baseband samples to provide a correlation result for the selected permutation of bit values;
   ranking the correlation results; and
   selecting the highest ranked correlation result for the decoded 12-bit data.

6. The method of claim 5, further comprising:
   identifying a first rotational phase for a first one of the 10-bit output data that is received at a first instance of time;
   identifying a second rotational phase for a second one of the 10-bit output data that is received at a second instance of time, wherein the second instance of time occurs after the first instance of time; and
   decoding a 2-bit output data at the second instance of time from a difference between the first rotational phase and the second rotational phase.

7. The method of claim 6, wherein the first rotational phase is indicated with a first quadrant signal, the second rotational phase is indicated with a second quadrant signal, and wherein decoding comprises applying an exclusive OR operation on the first quadrant signal and the second quadrant signal.

8. The method of claim 6, wherein the first rotational phase is indicated from a first phase output of a correlator at the first instance of time, and wherein the second rotation phase is indicated from a second phase output of the correlator at the second instance of time.

* * * * *